(12) United States Patent
Kai

(10) Patent No.: US 6,881,894 B2
(45) Date of Patent: Apr. 19, 2005

(54) EMI SHIELDING STRUCTURES

(75) Inventor: Takanobu Kai, Tokyo (JP)

(73) Assignee: NEC LCD Technologies, Ltd., Kawasaki (JP)

( * ) Notice: Subject to any disclaimer, the term of this patent is extended or adjusted under 35 U.S.C. 154(b) by 0 days.

(21) Appl. No.: 09/975,791

(22) Filed: Oct. 12, 2001

(65) Prior Publication Data

US 2003/0070824 A1 Apr. 17, 2003

(30) Foreign Application Priority Data

Oct. 13, 2000 (JP) ........................................ 2000-313212

(51) Int. Cl.$^7$ ................................................ H05K 9/00
(52) U.S. Cl. .............................. 174/35 GC; 174/35 R
(58) Field of Search .......................... 174/35 R, 35 MS; 361/816, 818, 800

(56) References Cited

U.S. PATENT DOCUMENTS

| | | | |
|---|---|---|---|
| 5,704,117 A | * 1/1998 | Mok et al. ..................... | 29/841 |
| 5,814,761 A | * 9/1998 | Piazza ....................... | 174/35 R |
| 5,825,634 A | * 10/1998 | Moorehead, Jr. ........... | 361/816 |
| 6,051,781 A | * 4/2000 | Bianca et al. .............. | 174/35 C |
| 6,144,557 A | * 11/2000 | Chen et al. ................. | 361/704 |
| 6,297,967 B1 | * 10/2001 | Davidson et al. ........... | 361/800 |

FOREIGN PATENT DOCUMENTS

| | | |
|---|---|---|
| JP | 57-135793 | of 0000 |
| JP | 59-173397 | 11/1984 |
| JP | 60-129197 | 8/1985 |
| JP | 06-152176 | 5/1994 |
| JP | 6-66090 | 9/1994 |
| JP | 06-283877 | 10/1994 |
| JP | 07-248481 | 9/1995 |
| JP | 07-333638 | 12/1995 |
| JP | 09-138389 | 5/1997 |
| JP | 10-041667 | 2/1998 |
| JP | 10-062756 | 3/1998 |
| JP | 2000-156588 | 6/2000 |
| KR | 1998-021705 | 6/1998 |

OTHER PUBLICATIONS

Japanese Office Action dated Aug. 12, 2004.

* cited by examiner

*Primary Examiner*—Hung V. Ngo
(74) *Attorney, Agent, or Firm*—Katten Muchin Zavis Rosenman

(57) ABSTRACT

An EMI shielding structure comprises a printed circuit having at least one contact protuberance forming part of a ground plane. An EMI shield member is placed in a desired alignment over the printed circuit. The EMI shield member is formed with an aperture receiving the contact protuberance in contact with the aperture defining contact wall so that electric continuity between the EMI shield member and the ground plane is ensured.

18 Claims, 5 Drawing Sheets

EMI SHIELDING STRUCTURES

BACKGROUND OF THE INVENTION

1. Field of the Invention

The present invention generally relates to electronic assemblies surrounded by enclosures that prevent passage of electromagnetic or radio frequency interference (RFI). Enclosing structures combine shield members with ground planes associated with the electronic assemblies. The present invention relates to structures for electrically connecting shield members to ground planes.

2. Description of the Related Art

Electronic assemblies, containing interference sensitive or signal generating devices, require isolation by shield members and ground planes to protect the devices or prevent damage by the signals they emit. Shield members must act as a shield for electromagnetic and radio frequency waves. The interference caused by such waves in electronic devices is commonly referred to as electromagnetic interference (EMI) or radio frequency interference (RFI), hereinafter jointly referred to as EMI.

Effective EMI shielding requires electrical continuity between an EMI shield and a ground plane associated with, e.g. a printed circuit. A suitable form of EMI shield comprises an enclosure surrounding an electronic assembly. The enclosure often has several parts suitably connected to form an electro-conductive structure around the assembly. Required parts include a ground plane associated with the electronic assembly and an EMI shield member, electrically connected to the ground plane.

JP-B2 7-63114 describes an EMI shielding structure wherein an EMI shield member has a shield plate fixed to its inner surface. After placing the EMI shield member in desired alignment over an electronic assembly, application of pressure brings the shield plate into resilient contact with a ground plane of a printed circuit.

JP-A 9-138389 describes an EMI shielding structure using a frame ground consisting of two metal strips. The frame ground is soldered to an EMI shield member and also to a ground plane of a printed circuit.

JP-A 10-62756 describes an EMI shielding structure wherein an EMI shield member, which has been pressed out to form protuberances, is used, and the protuberances are brought into contact with a ground plane of a printed circuit.

JP-A 7-248481 describes an EMI shielding structure wherein an EMI shield member is formed with a ground terminal, and the ground terminal is fitted into a connector terminal on a ground plane of a printed circuit.

JP-A 7-333638 describes an EMI shielding structure wherein an EMI shielding film covers a printed circuit. The EMI shielding film consists of a conductive layer, an insulating layer, and an adhesive layer. With the adhesive layer, the EMI shielding film is adhered to the printed circuit.

Referring to FIG. 11, an EMI shielding structure according to a less preferred embodiment will be described. A printed circuit 110 supports electronic components, not shown, that are protected by an EMI shield member 112. A plurality of conic contact protuberances, only one shown at 111, are formed on the printed circuit 110. Each contact protuberance is part of the ground plane of the printed circuit 110. After placing the EMI shield member 112 in desired alignment over the electronic assembly, application of pressure brings the inner surface of the EMI shield member 112 into contact with the vertex of each contact protuberance 111. Electrical connection between the EMI shield member 112 and the contact protuberances 111 may be ensured by joining them by solder.

Modules are now widely used as electronic assemblies. Such modules are required to grow thinner and thinner to increase their competitive powers in market. A reduction in thickness of a module inevitably requires a reduction in thickness of at least some of its parts. The reduction in thickness of modules causes a drop in stiffness of the final product, such as a liquid crystal display (LCD), against bending stress.

If the EMI shielding structure is installed in such a LCD, application of pressure to the surface of the LCD may cause loose contact between some of the conical contact protuberances 111 and the EMI shield member 112. Occurrence of such loose contact may cause abnormality in image produced by the LCD.

According to the EMI shielding structure shown in FIG. 11, the vertex of each conical contact protuberance 111 and the EMI shield member 112 makes a point contact. Thus, an increased number of contact protuberances 111 are required to provide a sufficiently low resistance of the electrical connection between the EMI shield member 112 and the ground plane of the printed circuit 110.

In the EMI shielding structure shown in FIG. 11, the thickness, as indicated at B, of the EMI shield member 112 adds to an elevation of the remote surface of the EMI shield member 112 from the printed circuit 110. If each contact protuberance 111 has the height A, the final elevation of the remote surface of the EMI shield member 112 can be expressed as the sum (A+B).

As mentioned before, after placing the EMI shield member 112 in a desired alignment over the electronic assembly, application of pressure to the EMI shield member 112 causes contact between the vertexes of each contact protuberance 111 and the surface of the EMI shield member 112. However, it is difficult to confirm whether the contact protuberances 111 have been brought into contact with the surface of the EMI shield member 112.

The EMI shielding structure shown in FIG. 11 is satisfactory to some extent. However, a need remains for an EMI shielding structure, which is free from the above-mentioned shortcomings inherent with the EMI shielding structure shown in FIG. 11.

SUMMARY OF THE INVENTION

An object of the present invention is to provide an EMI shielding structure, which provides a reliable and continuing electrical connection between an EMI shield member and a ground plane of a printed circuit as well as a reduction in elevation of the remote surface of the EMI shield member from the printed circuit and an elimination of difficulty in confirming whether the electrical connection is made after completion of the assembly.

According to one exemplary implementation of the invention, there is provided an EMI shielding structure, comprising:

a printed circuit having at least one contact protuberance; and an EMI shield member formed with an aperture receiving the contact protuberance, the EMI shield member having a contact wall defining the aperture, the aperture defining contact wall being in contact with the contact protuberance received in the aperture.

BRIEF DESCRIPTION OF THE DRAWINGS

The foregoing and other objects, features and advantages of the invention will be apparent from the following more particular description of exemplary embodiments of the invention as illustrated in the accompanying drawings. The drawings are not necessarily scale, emphasis instead being placed upon illustrating the principles of the invention.

DESCRIPTION OF THE PREFERRED EMBODIMENT

Figure 1:
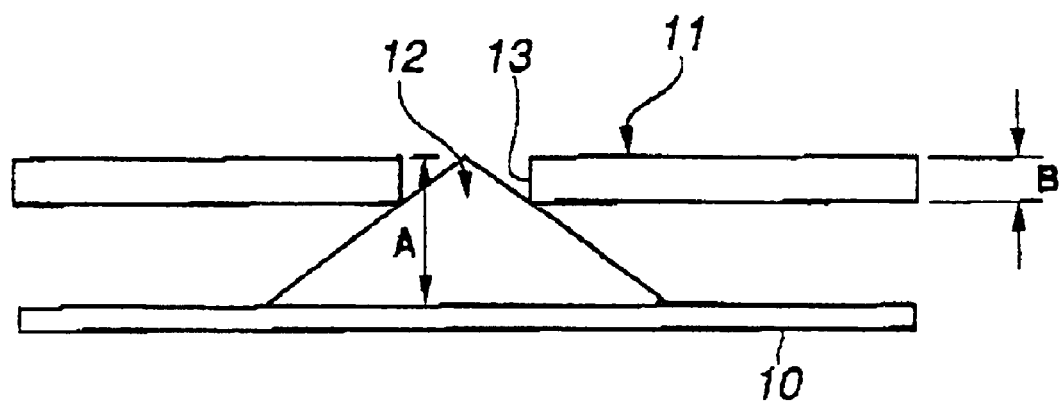
FIG. 1 shows a schematic cross-sectional view of a portion of an EMI shielding structure according to a first embodiment of the present invention.
Figure 2:
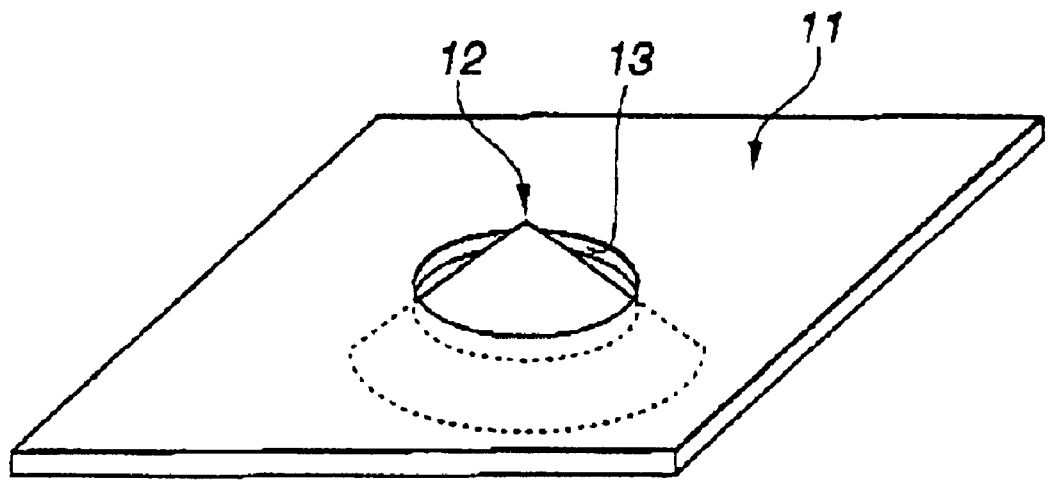
FIG. 2 shows a schematic perspective view of the portion of the EMI shielding structure shown in FIG. 1.

FIGS. 1 and 2 illustrate a portion of a printed circuit 10 of an electronic assembly. The printed circuit 10 supports electronic components, not shown, that are protected by an EMI shield member 11. A plurality of contact protuberances of conductive material, only one being shown at 12, are formed on the printed circuit 10 in alignment with apertures of the EMI shield member 11, respectively. Each contact protuberance is part of the ground plane of the printed circuit 10. The EMI shield member 11 has a plurality of contact walls, only one being shown at 13, defining the plurality of apertures, respectively. After placing the EMI shield member 11 in desired alignment over the electronic assembly, application of pressure brings each aperture defining contact wall 13 into contact with the corresponding one of the contact protuberances 12. After completed, the contact protuberances 12 overlaps the apertures of the EMI shield member 11, respectively.

In the embodiment, each contact protuberance 12 is a circular cone. The circular cone is a closed surface consisting of a base bounded by a circle and a side surface consisting of all line segments joining a vertex with the points on the boundary of the base. Each contact protuberance 12 has its base on the printed circuit 10 and has its vertex within a level elevated by a height A (see FIG. 1).

In the embodiment, after placing the EMI shield member 11 in desired alignment over the electronic assembly, application of pressure brings each aperture defining contact wall 13 into contact with the side surface of the corresponding one of the conic contact protuberances 12. After completed, the vertexes of conic contact protuberances 12 are protruded through the apertures beyond the remote surface of the EMI shield member 11. The side surface of each conic contact protuberance 12 is in contact with the corresponding one of the aperture defining contact walls 13 along a closed contact curve. In the embodiment, the apertures are circular apertures.

Figure 11:
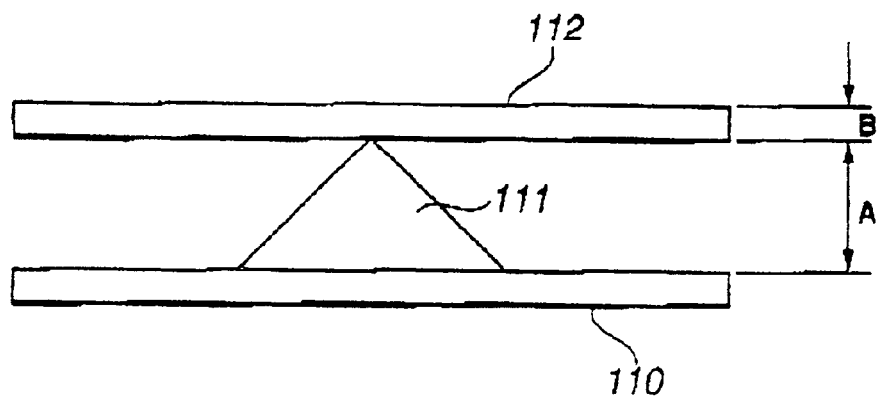
FIG. 11 shows a schematic cross-sectional view of a portion of an EMI shielding structure according to a less preferred embodiment.

As will be appreciated by one of ordinary skill in the art as one advantage over the less preferred embodiment shown in FIG. 11 that the EMI shielding structure according to the embodiment has increased contact area between the EMI shield member 11 and the contact protuberances 12. Accordingly, electrical continuity between the EMI shield member 11 and the ground plane of the printed circuit 10 can be held above a satisfactorily high level.

The increased contact area lowers electric contact resistance, thus providing effective shielding.

Electric resistance between the contact protuberances 12 and the shielding cover 11 in the EMI shielding structure of FIGS. 1 and 2, and electric resistance between the contact protuberances 111 and the EMI shield member 112 in the EMI shielding structure of FIG. 11 are measured in terms of (average), ($\sigma_{n-1}$), (maximum), and (minimum). The results are:

|  | Ave. | $\sigma_{n-1}$ | Max. | Min. |
| --- | --- | --- | --- | --- |
| FIG. 11 | 16.95 Ω | 8.73 Ω | 28.14 Ω | 4.80 Ω |
| FIGS. 1 & 2 | 1.04 Ω | 0.53 Ω | 1.70 Ω | 0.47 Ω |

This table clearly shows, as an advantage of the EMI shielding structure of FIGS. 1 and 2, that the electric connection between the cover 11 and the ground plane of the circuit 10 has low electric resistance. This low electric resistance causes a remarkably high performance as a shield for EMI.

It will be appreciated by one of ordinary skill in the art, as another advantage of the EMI shielding structure of FIGS. 1 and 2, that, even after assembly has been completed, confirmation whether electric connection between the protuberances and the EMI shield member is secured can be made quite easily, because the protuberances projects outwardly from the apertures. Accordingly, removing some parts for such confirmation is no longer necessary.

It will also be appreciated by one of ordinary skill in the art, as still another advantage, that measurement of electric resistance between the protuberances and the EMI shield member has become easy.

It will further be appreciated by one of ordinary skill in the art, as further advantage, that the height A of the protuberances determines the final elevation of the EMI shield member 11 from the circuit 10, which is less than the final elevation of the EMI shield member 112 from the circuit 110, which is defined as a sum (A+B), in the EMI shielding structure of FIG. 11. The present invention has been applied to an electric assembly identified by 7628C-18M. The elevation from the circuit has been reduced by 0.4 mm.

In the embodiment, each of the protuberances is a circular cone. The invention is not limited to the form of a circular cone. In other embodiment, a cone with a base that is bounded by any desired simple closed curve may be used.

Figure 3:
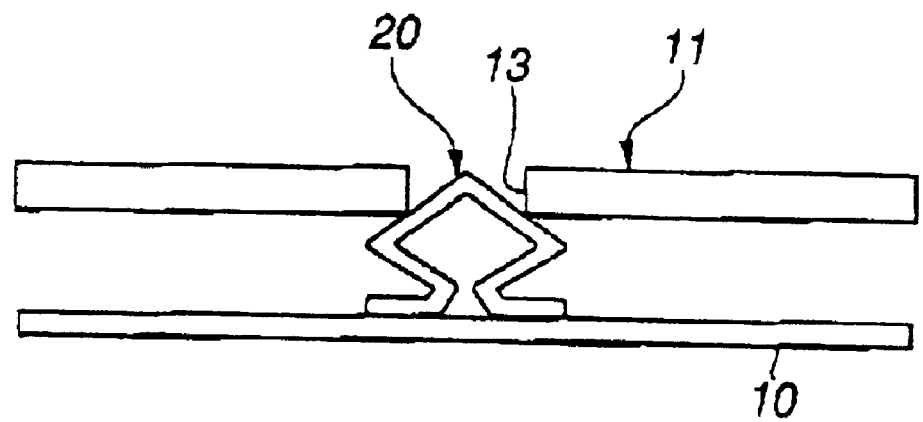
FIG. 3 shows a schematic cross-sectional view of a portion of an EMI shielding structure according to a second embodiment of the present invention.
Figure 4:
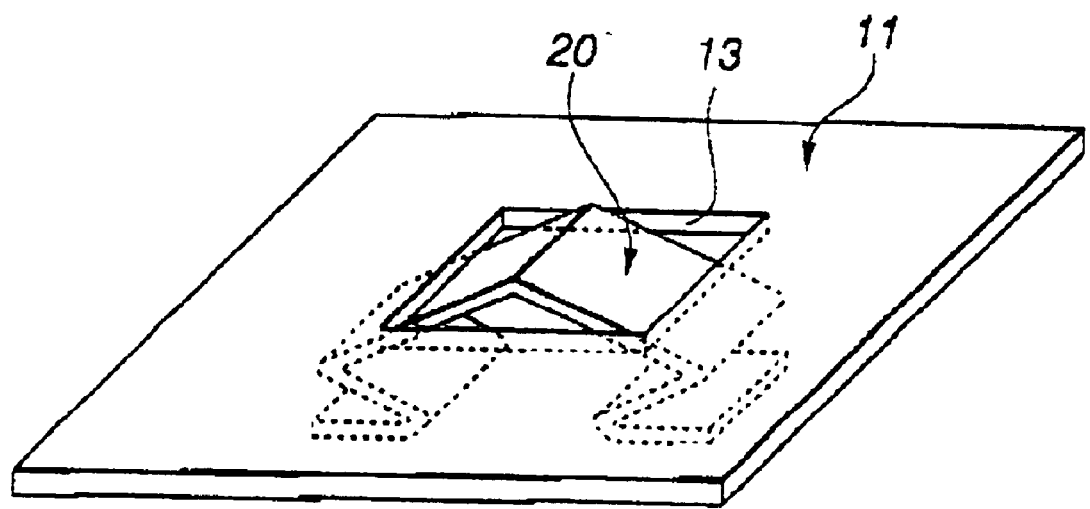
FIG. 4 shows a schematic perspective view of the portion of the EMI shielding structure shown in FIG. 3.

Referring to FIGS. 3 and 4, an EMI shielding structure according to a second preferred embodiment of the present invention will be described.

The second embodiment is substantially the same as the first embodiment in that the apertures of the EMI shield member receive the contact protuberances on the printed circuit, respectively. However, according to the second embodiment, contact protuberances, only one being shown at 20, can be resiliently deformed between a printed circuit 10 and an EMI shield member 11, which property the contact protuberances 12 of the first embodiment fail to possess.

Bending a rectangular strip of springy thin metal sheet forms each contact protuberance 20. In the embodiment, each contact protuberance 20 has spaced parallel bent lines. The spaced bent lines define two edge portions resting on the printed circuit 10, and four-sided pantograph-like structure between the two edge portions. The four-sided pantograph-like structure includes two lower flat sides connected, via the bent lines, to the two edge portions, respectively, and two upper flat sides connected, via the bent lines, to the two lower plane sides, respectively. The upper two flat sides are connected to each other via the bent line at the ridge of the structure. In stressed state tending to compress the four-sided structure toward the printed circuit 10, the contact protuberance 20 can be deformed resiliently by increasing the angle around the bent line at the ridge and reducing the angle around each of the other bent lines.

As different from the first embodiment, the EMI shield member 11 is formed with rectangular apertures, each being defined by four-sided contact wall 13.

In the second embodiment, after placing the EMI shield member 11 in desired alignment over the electronic assembly, application of pressure brings each aperture defining contact wall 13 into contact with the upper two flat sides of the corresponding one of the contact protuberances 20. After completed, the contact protuberances 20 are in the stressed state, thereby to secure their contact with the EMI shield member 11 even if there occurs local variation in distance between the EMI shield member 11 and the printed circuit 10.

Figure 5:
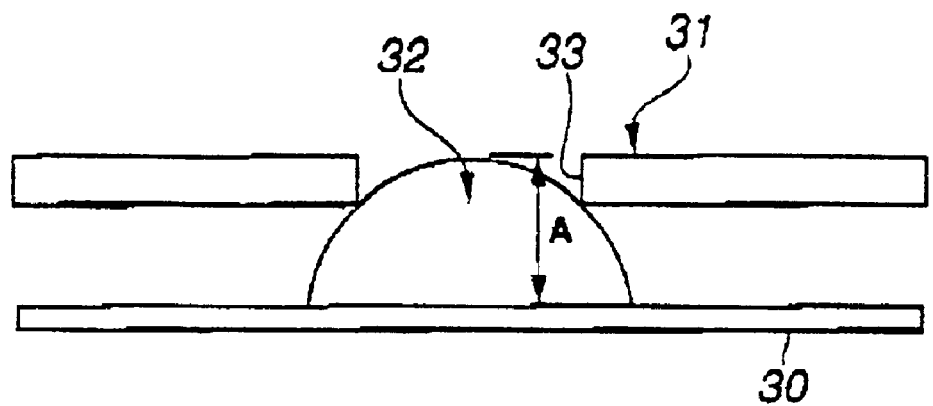
FIG. 5 shows a schematic cross-sectional view of a portion of an EMI shielding structure according to a third embodiment of the present invention.
Figure 6:
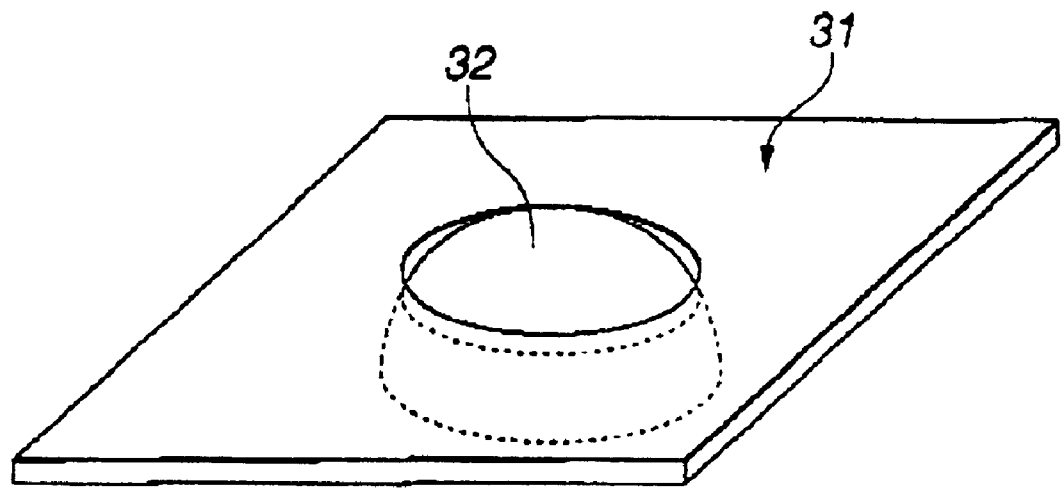
FIG. 6 shows a schematic perspective view of the portion of the EMI shielding structure shown in FIG. 5.

Referring to FIGS. 5 and 6, an EMI shielding structure according to a third preferred embodiment of the present invention will be described.

The third embodiment is substantially the same as the first embodiment in that the circular apertures of the EMI shield member receive the contact protuberances on the printed circuit, respectively. However, according to the third embodiment, contact protuberances, only one being shown at 32, have spherical side surfaces.

In the third embodiment, after placing an EMI shield member 31 in desired alignment over the electronic assembly, application of pressure brings each aperture defining contact wall 33 into contact with the spherical side surface of the corresponding one of the contact protuberances 32. After completed, the tops of spherical contact protuberances 32 are located in the apertures as high as the remote surface of the EMI shield member 31. The spherical side surface of each contact protuberance 32 is in contact with the corresponding one of the aperture defining contact walls 33 along an edge of the wall 33.

As shown in FIG. 5, it will be appreciated by one of ordinary skill in the art that, according to the third embodiment, the top of spherical side surface of each contact protuberance 32 is elevated from the printed circuit 30 by a height A, and this height determines the final elevation of the remote surface of the EMI shield member 31 from the printed circuit 30.

Figure 7:
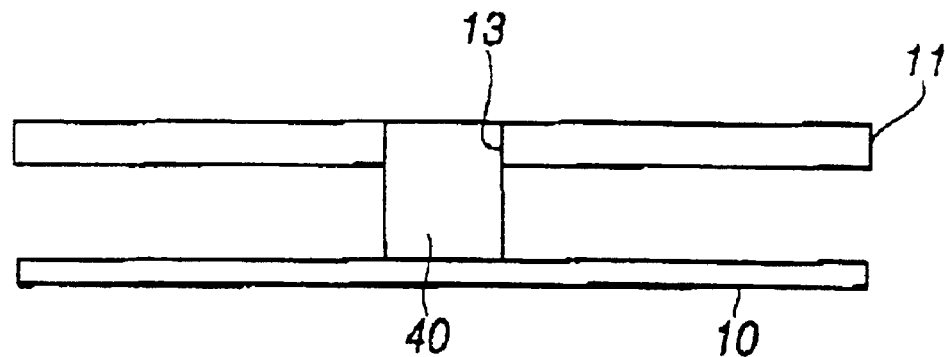
FIG. 7 shows a schematic cross-sectional view of a portion of an EMI shielding structure according to a fourth embodiment of the present invention.
Figure 8:
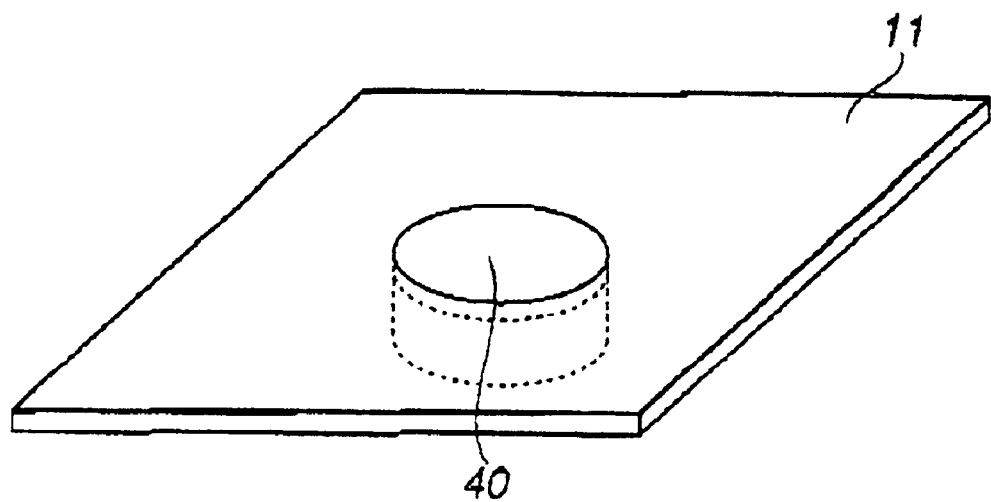
FIG. 8 shows a schematic perspective view of the portion of the EMI shielding structure shown in FIG. 7.

Referring to FIGS. 7 and 8, an EMI shielding structure according to a fourth preferred embodiment of the present invention will be described.

The fourth embodiment is substantially the same as the first embodiment in that the circular apertures of the EMI shield member receive the contact protuberances on the printed circuit, respectively. However, according to the fourth embodiment, contact protuberances, only one being shown at 40, are right cylinders, respectively, each having cylindrical side surface. Each cylindrical contact protuberance 40 is dimensioned so that it may be fitted into one of circular apertures defined by contact walls 13 of an EMI shield member 11. In this embodiment, the diameter of each cylindrical contact protuberance 40 is substantially the same as the diameter of the one circular aperture.

In the fourth embodiment, after placing the EMI shield member 11 in desired alignment over the electronic assembly, application of pressure brings each circular aperture defining contact wall 13 into contact with the cylindrical side surface of the corresponding one of the contact protuberances 40. After completed, the upper portions of contact protuberances 40 close the circular apertures with their tops as high as the remote surface of the EMI shield member 11. The cylindrical side surface of each contact protuberance 40 is in contact with the corresponding one of the aperture defining contact walls 13.

As shown in FIG. 7, it will be appreciated by one of ordinary skill in the art that, according to the fourth embodiment, the top of each contact protuberance 40 is elevated from the printed circuit 10 by a height, and this height determines the final elevation of the remote surface of the EMI shield member 11 from the printed circuit 10. This height is not limited to this illustrated example and may take any desired value as long as the contact protuberance 40 is elevated less further from the printed circuit 10 than the remote surface of the EMI shield member 11 is elevated from the printed circuit 10.

Figure 9:
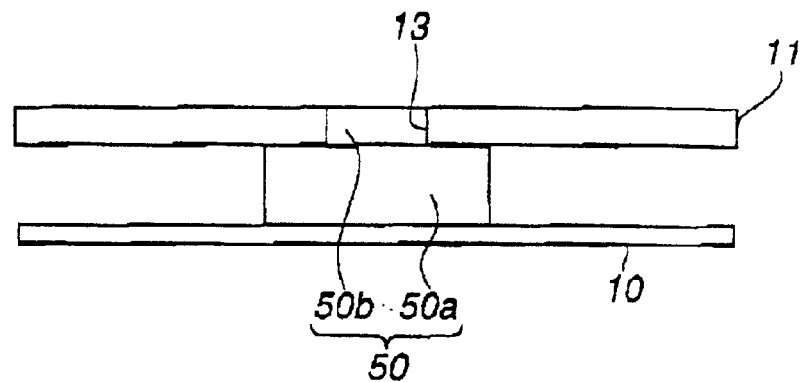
FIG. 9 shows a schematic cross-sectional view of a portion of an EMI shielding structure according to a fifth embodiment of the present invention.
Figure 10:
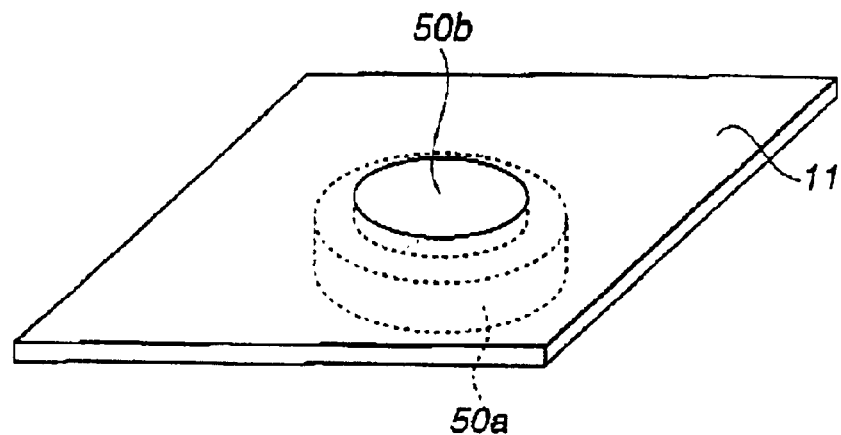
FIG. 10 shows a schematic perspective view of the portion of the EMI shielding structure shown in FIG. 9.

Referring to FIGS. 9 and 10, an EMI shielding structure according to a fifth preferred embodiment of the present invention will be described.

The fifth embodiment is substantially the same as the fourth embodiment in that the circular apertures of the EMI shield member receive the contact protuberances on the printed circuit, respectively. However, according to the fifth embodiment, contact protuberances, only one being shown at 50, are different from the contact protuberances 40 in that each contact protuberance 50 includes a first portion 50a between a printed circuit 10 and an EMI shield member 11 and an integral second portion 50b fitted into aperture defined by contact wall 13 of the EMI shield member 11. In the fifth embodiment, the first and second portions 50a and 50b are coaxial cylinders, respectively. The first portion 50a is formed on printed circuit 10 as part of a ground plane thereof. The second portion 50b is formed on the top of the first portion 50a. The second portion 50b has a uniform cross sectional area less than a uniform cross sectional area of the first portion 50a. In other words, the diameter of the second portion 50b is less than the diameter of the first portion 50a. The second portion 50b of each contact protuberance 50 is dimensioned so that it may be fitted into one of circular apertures defined by contact walls 13 of the EMI shield member 11. In this embodiment, the diameter of the second portion 50b of each contact protuberance 50 is substantially the same as the diameter of the one circular aperture.

In the fifth embodiment, after placing the EMI shield member 11 in desired alignment over the electronic assembly, application of pressure brings each circular aperture defining contact wall 13 into contact with the cylindrical side surface of the second portion 50b of the corresponding one of the contact protuberances 50. After completed, the second portions 50b of contact protuberances 50 close the circular apertures with their tops as high as the remote surface of the EMI shield member 11. Besides, the first portion 50a of each contact protuberance 50 allows the surface of the EMI shield member 11 to rest on the top thereof at around the associated second portion 50b. The cylindrical side surface of the second portion 50b of each contact protuberance 50 is in contact with the corresponding one of the aperture defining contact walls 13.

It will be appreciated by one of ordinary skill in the art that, according to the fifth embodiment, the EMI shield member 11 can be easily placed in desired alignment over the electronic assembly by allowing its apertures to receive the second portions 50b. Besides, the first portions 50a support the EMI shield member 11 to secure a space between the printed circuit 10 and the EMI shield member 11.

In the illustrated example of the fifth embodiment, the first and second portions 50a and 50b of each contact protuberance 50 have uniform cross sectional areas and cylindrical side surfaces. The present invention is not limited to the first and second portions having cylindrical side surfaces, respectively. The side surfaces of the first and second portions 50a and 50b may have any cross sectional profile. The cross sectional profile of the side surface of the second portion 50b may be a polygon, e.g., a triangle, a rectangle, a pentagon, and a hexagon.

As shown in FIG. 9, it will be appreciated by one of ordinary skill in the art that, according to the fifth embodiment, the second portion 50b of each contact protuberance 50 has such a height that the top thereof is as high as the remote surface of the EMI shield member 11. This height is not limited to this illustrated example and may take any desired value as long as the top of the second portion 50b is elevated less further from the printed circuit 10 than the remote surface of the EMI shield member 11 is elevated from the printed circuit 10.

From the preceding description, it will be appreciated by one of ordinary skill in the art, as one advantage over the less preferred embodiment shown in FIG. 11, that the EMI shielding structure according to each of the preceding embodiments has increased contact area between the EMI shield member and the contact protuberances. Accordingly, electrical continuity between the EMI shield member and the ground plane of the printed circuit can be held above a satisfactorily high level.

It will also be appreciated by one of ordinary skill in the art, as another advantage, that, even after assembly has been completed, confirmation whether electric connection between the protuberances and the EMI shield member is secured can be made quite easily, because the protuberances projects are located within the apertures. Accordingly, removing some parts for such confirmation is no longer necessary.

Further, it will be appreciated by one of ordinary skill in the art, as still another advantage, that measurement of electric resistance between the protuberances and the EMI shield member has become easy.

Still further, it will be appreciated by one of ordinary skill in the art, as further advantage, that the height of the protuberances determines the final elevation of the shielding cover from the circuit, which is less than the final elevation of the EMI shield member 112 from the circuit 110, which is defined as a sum (A+B), in the EMI shielding structure of FIG. 11.

While the present invention has been particularly described, in conjunction with preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An EMI shielding structure, comprising:
    a printed circuit having a ground plane and at least one contact protuberance on the ground plane and a terminal end of the contact protuberance elevated from the ground plane by a predetermined height; and
    an EMI shield member formed with an aperture receiving the contact protuberance,
    the aperture having an unchanging shape and area throughout an entire thickness of the EMI shield member, and
    the EMI shield member having a contact wall defining the aperture, the aperture defining contact wall being in contact with the contact protuberance received in the aperture to hold the terminal end to keep the EMI shield member in a predetermined parallel relationship with the ground plane of said printed circuit board, the contact protuberance being dimensioned such that the contact protuberance supports the EMI shield member.

2. The EMI shielding structure as claimed in claim 1, wherein the contact protuberance has spherical side surface.

3. The EMI shielding structure as claimed in claim 1, wherein the contact protuberance is in biased contact with the EMI shield member.

4. The EMI shielding structure as claimed in claim 3, wherein the contact protuberance is formed from a strip of springy metal sheet.

5. The EMI shielding structure as claimed in claim 4, wherein the contact protuberance can be resiliently deformed between the printed circuit and the EMI shield member.

6. The EMI shielding structure as claimed in claim 4, wherein the contact protuberance includes a pantograph-like structure.

7. A liquid crystal display including an EMI shielding structure as claimed in claim 1.

8. An EMI shielding structure, comprising:
    a printed circuit having a ground plane and at least one contact protuberance on the ground plane and a terminal end of the contact protuberance elevated from the ground plane by a predetermined height; and
    an EMI shield member formed with an aperture receiving the contact protuberance, the aperture having an unchanging shape and area throughout an entire thickness of the EMI shield member, and
    the EMI shield member having a contact wall defining the aperture, the aperture defining contact wall being in contact with the contact protuberance received in the aperture to hold the terminal end to keep the EMI shield member in a predetermined parallel relationship with the ground plane of said printed circuit board,
    the contact protuberance having, as the terminal end, a vertex protruded through the aperture beyond the EMI shield member, the contact protuberance being dimensioned such that the contact protuberance supports the EMI shield member.

9. The EMI shielding structure as claimed in claim 8, wherein the contact protuberance has cross sections gradually reducing in area toward the vertex.

10. The EMI shielding structure as claimed in claim 8, wherein the contact protuberance is a circular cone.

11. An EMI shielding structure, comprising:
a printed circuit having a ground plane and at least one contact protuberance on the ground plane and a terminal end of the contact protuberance elevated from the ground plane by a predetermined height; and
an EMI shield member formed with an aperture receiving the contact protuberance,
the aperture having an unchanging shape and area throughout an entire thickness of the EMI shield member, and
the EMI shield member having a contact wall defining the aperture, the aperture defining contact wall being in contact with the contact protuberance received in the aperture to hold the terminal end to keep the EMI shield member in a predetermined parallel relationship with the ground plane of said printed circuit board,
the contact protuberance having a uniform cross sectional area, being fitted into the aperture, and being dimensioned such that the contact protuberance supports the EMI shield member.

12. The EMI shielding structure as claimed in claim 11, wherein the contact protuberance has a top, which is elevated from the printed circuit not further than the remote surface of the EMI shield member is elevated from the printed circuit.

13. An EMI shielding structure, comprising:
a printed circuit having a ground plane and at least one contact protuberance on the ground plane and a terminal end of the contact protuberance elevated from the ground plane by a predetermined height; and
an EMI shield member formed with an aperture receiving the contact protuberance,
the aperture having an unchanging shape and area throughout an entire thickness of the EMI shield member, and
the EMI shield member having a contact wall defining the aperture, the aperture defining contact wall being in contact with the contact protuberance received in the aperture to hold the terminal end to keep the EMI shield member in a predetermined parallel relationship with the ground plane of said printed circuit board,
the contact protuberance having a first portion and an integral second portion fitted into the aperture;
the second portion having a cross sectional area less than a cross sectional area of the first portion;
the first portion allowing the EMI shield member to rest and be supported thereon.

14. The EMI shielding structure as claimed in claim 13, wherein the second portion has a top, which is elevated from the printed circuit not further than the remote surface of the EMI shield member is elevated from the printed circuit.

15. A method of assembling an EMI shielding structure, comprising:
forming a printed circuit with a ground plane and at least one contact protuberance on the ground plane and a terminal end of the contact protuberance elevated from the ground plane by a predetermined height;
forming an EMI shield member with at least one aperture and a contact wall defining the aperture,
the aperture having an unchanging shape and area throughout an entire thickness of the EMI shield member; and
placing the EMI shield member in a desired alignment over the printed circuit in a manner that the aperture receives the contact protuberance in contact with the aperture defining contact wall to hold the terminal end to keep the EMI shield member in a predetermined parallel relationship with the ground plane of said printed circuit board, and such that the contact protuberance supports the EMI shield member.

16. The method as claimed in claim 15, wherein the contact protuberance protrudes through the aperture beyond the EMI shield member.

17. The method as claimed in claim 15, wherein the contact protuberance is fitted into the aperture.

18. An EMI shielding structure, comprising:
a ground plane;
at least one contact protuberance on the ground plane, the at least one contact protuberance having a terminal end elevated from the ground plane by a predetermined height; and
an EMI shield member formed with an aperture receiving the contact protuberance,
the aperture having an unchanging share and area throughout an entire thickness of the EMI shield member, and
the EMI shield member having a contact wall defining the aperture, the aperture defining contact wall being in contact with the contact protuberance received in the aperture to hold the terminal end to keep the EMI shield member in a predetermined parallel relationship with the ground plane of said printed circuit board,
the contact protuberance being dimensioned such that the contact protuberance supports the EMI shield member.

\* \* \* \* \*